(12) United States Patent
Lee et al.

(10) Patent No.: US 11,765,887 B2
(45) Date of Patent: Sep. 19, 2023

(54) CAPACITOR, METHOD OF CONTROLLING THE SAME, AND TRANSISTOR INCLUDING THE SAME

(71) Applicant: Samsung Electronics Co., Ltd., Suwon-si (KR)

(72) Inventors: Jaeho Lee, Seoul (KR); Boeun Park, Hwaseong-si (KR); Yongsung Kim, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 17/116,097

(22) Filed: Dec. 9, 2020

(65) Prior Publication Data

US 2021/0358694 A1 Nov. 18, 2021

(30) Foreign Application Priority Data

May 13, 2020 (KR) .................. 10-2020-0057191

(51) Int. Cl.
*G11C 11/22* (2006.01)
*H10B 12/00* (2023.01)
(Continued)

(52) U.S. Cl.
CPC ............. *H10B 12/37* (2023.02); *G01G 7/00* (2013.01); *G01G 7/06* (2013.01); *G11C 11/221* (2013.01);
(Continued)

(58) Field of Classification Search
CPC ... H01G 7/06; G01G 7/00; G01G 7/06; G11C 11/221; G11C 11/223; G11C 11/2275;
(Continued)

(56) References Cited

U.S. PATENT DOCUMENTS

| | | | | |
|---|---|---|---|---|
| 5,406,196 A | * | 4/1995 | Sameshima | G01R 19/30 324/72 |
| 5,524,092 A | * | 6/1996 | Park | H01L 28/55 257/295 |

(Continued)

FOREIGN PATENT DOCUMENTS

| | | |
|---|---|---|
| CN | 109785878 A | 5/2019 |
| JP | 2012043947 A | 3/2012 |

(Continued)

OTHER PUBLICATIONS

Daniel J. R. Appleby et al., "Experimental Observation of Negative Capacitance in Ferroelectrics at Room Temperature" Nano Letters 3864, ACS Publications (2014) 14, pp. 3864-3868.

(Continued)

*Primary Examiner* — Jay W. Radke
(74) *Attorney, Agent, or Firm* — HARNESS, DICKEY & PIERCE, P.L.C.

(57) ABSTRACT

A capacitor comprises a first electrode, a second electrode provided on the first electrode, a ferroelectric film provided between the first electrode and the second electrode, and a dielectric film provided between the ferroelectric film and the second electrode, impedance of the ferroelectric film and impedance of the dielectric film are determined such that a control voltage applied between the first electrode and the second electrode is equal to a capacitance boosting operating voltage, and the capacitance boosting operating voltage is determined by the following equation:

$$V_{MAX} = \left(1 + \frac{|Z_2|}{|Z_1|}\right) t_F E_{FM}$$

where $V_{MAX}$ is a capacitance boosting operating voltage, $Z_1$ is impedance of the ferroelectric film, $Z_2$ is impedance of the (Continued)

dielectric film, $t_F$ is a thickness of the ferroelectric film, and $E_{FM}$ is an electric field applied to the ferroelectric film having a maximum polarization.

25 Claims, 4 Drawing Sheets

(51) Int. Cl.
*H01L 49/02* (2006.01)
*H01L 29/51* (2006.01)
*G01G 7/00* (2006.01)
*G01G 7/06* (2006.01)
*G11C 19/00* (2006.01)
*G11C 19/18* (2006.01)

(52) U.S. Cl.
CPC ........ *G11C 11/223* (2013.01); *G11C 11/2275* (2013.01); *G11C 19/005* (2013.01); *G11C 19/18* (2013.01); *H01L 28/56* (2013.01); *H01L 29/516* (2013.01); *H10B 12/33* (2023.02)

(58) Field of Classification Search
CPC . G11C 19/005; G11C 19/18; H01L 27/10835; H01L 28/56; H01L 29/516; H01L 23/642; H01L 28/40; H01L 29/78391; H10B 12/37; H10B 12/33
See application file for complete search history.

(56) References Cited

U.S. PATENT DOCUMENTS

| | | | | |
|---|---|---|---|---|
| 5,689,456 | A * | 11/1997 | Kobayashi | H01L 27/11502 |
| | | | | 257/295 |
| 9,368,280 | B2 | 6/2016 | Park et al. | |
| 10,210,921 | B1 * | 2/2019 | Hwang | G11C 11/2255 |
| 10,600,808 | B2 * | 3/2020 | Schröder | H01L 28/40 |
| 10,854,707 | B2 * | 12/2020 | Yoo | H01L 28/60 |
| 11,527,646 | B2 * | 12/2022 | Heo | H01L 29/40111 |
| 2008/0231667 | A1 * | 9/2008 | Arakawa | B41J 2/1646 |
| | | | | 501/134 |
| 2008/0302658 | A1 * | 12/2008 | Sasaki | H01L 41/1873 |
| | | | | 252/62.9 R |
| 2009/0294818 | A1 * | 12/2009 | Ishida | G11C 13/0016 |
| | | | | 528/7 |
| 2012/0048508 | A1 * | 3/2012 | Erbil | F25B 29/003 |
| | | | | 165/60 |
| 2016/0064391 | A1 | 3/2016 | Li et al. | |
| 2016/0301230 | A1 | 10/2016 | Lee | |
| 2019/0074295 | A1 * | 3/2019 | Schröder | H01L 29/40111 |
| 2019/0147935 | A1 * | 5/2019 | Yoo | G11C 11/2297 |
| | | | | 365/145 |
| 2019/0181147 | A1 | 6/2019 | Liu | |
| 2020/0013446 | A1 * | 1/2020 | Cho | G11C 11/1675 |
| 2020/0013945 | A1 * | 1/2020 | Guhathakurta | H01L 41/193 |
| 2020/0212168 | A1 * | 7/2020 | Yoo | H01L 29/78391 |
| 2020/0303417 | A1 * | 9/2020 | Teo | H01L 27/11585 |
| 2021/0005728 | A1 * | 1/2021 | Cheng | H01L 29/7926 |
| 2021/0091227 | A1 * | 3/2021 | Heo | H01L 29/40111 |
| 2021/0358694 | A1 * | 11/2021 | Lee | G11C 19/005 |
| 2021/0359101 | A1 * | 11/2021 | Heo | H01L 29/40111 |
| 2022/0013353 | A1 * | 1/2022 | Lu | H01L 21/02516 |
| 2022/0189546 | A1 * | 6/2022 | Gong | G11C 11/5657 |

FOREIGN PATENT DOCUMENTS

| | | |
|---|---|---|
| KR | 10-2014-0092107 A | 7/2014 |
| KR | 20170081986 A | 7/2017 |

OTHER PUBLICATIONS

Keum Do Kim et al., "Transient Negative Capacitance Effect in Atomic-Layer-Deposited $Al_2O_3/Hf_{0.3}Zr_{0.7}O_2$ Bilayer Thin Film" Adv. Funct. Mater 1808228 (2019) p. 1 of 9.

Yue Zheng et al., "Critical properties of symmetric nanoscale metal-ferroelectric-metal capacitors" ScienceDirect, Acta Materialia 58, (2010) pp. 3050-3058.

Sou-Chi Chang et al., "Physical Origin of Transient Negative Capacitance in a Ferroelectric Capacitor" American Physical Society, Physical Review Applied 9, 014010 (2018).

Extended European Search Report dated Aug. 26, 2021, in European Application No. 21163427.4.

First Office Action dated Jul. 20, 2023 in Chinese Application No. 202110047413.5.

* cited by examiner

CAPACITOR, METHOD OF CONTROLLING THE SAME, AND TRANSISTOR INCLUDING THE SAME

CROSS-REFERENCE TO RELATED APPLICATION

This application claims the benefit of Korean Patent Application No. 10-2020-0057191, filed on May 13, 2020, in the Korean Intellectual Property Office, the disclosure of which is incorporated herein in its entirety by reference.

BACKGROUND

1. Field

The present disclosure relates to a capacitor, a method of controlling the same, and a transistor including the same.

2. Description of Related Art

With the development of technology, devices such as transistors and capacitors continue to be scaled down in size. Scaled-down devices have a limited thickness. Accordingly, there is an increasing demand for materials having a high dielectric constant and structures thereof.

With regard to the materials having a high dielectric constant and structures thereof, research is being conducted on the effect of boosting capacitance using negative capacitance. The capacitance boosting effect may sharply increase the dielectric constant of a capacitor when a voltage is applied to the capacitor.

SUMMARY

An aspect of the present disclosure provides an electronic device having a capacitance boosting effect.

An aspect of the present disclosure provides a capacitor having a capacitance boosting effect.

An aspect of the present disclosure provides a capacitor having a transistor boosting effect.

Another aspect of the present disclosure also provides a method of controlling a capacitor having a capacitance boosting effect.

However, aspects of the present disclosure are not limited to the above disclosure.

Additional aspects will be set forth in part in the description which follows and, in part, will be apparent from the description, or may be learned by practice of the presented embodiments of the disclosure.

In an aspect, provided is a method of controlling a capacitor comprising a first electrode, a second electrode provided on the first electrode, a ferroelectric film provided between the first electrode and the second electrode, and a dielectric film provided between the ferroelectric film and the second electrode, the method comprising controlling an impedance of the ferroelectric film and an impedance of the dielectric film such that a control voltage applied between the first electrode and the second electrode is equal to a capacitance boosting operating voltage, wherein the capacitance boosting operating voltage is determined by Equation 1:

$$V_{MAX} = \left(1 + \frac{|Z_2|}{|Z_1|}\right) t_F E_{FM} \quad \text{[Equation 1]}$$

where $V_{MAX}$ is a capacitance boosting operating voltage, $Z_1$ is the impedance of the ferroelectric film, $Z_2$ is the impedance of the dielectric film, $t_F$ is a thickness of the ferroelectric film, and $E_{FM}$ is an electric field applied to the ferroelectric film having the maximum polarization change produced thereto.

The ferroelectric film may include a conductance component and a capacitance component connected in parallel, and the dielectric film may include a conductance component and a capacitance component connected in parallel.

An angular frequency of the control voltage may be determined such that the control voltage is equal to the capacitance boosting operating voltage. The capacitance boosting operating voltage may be determined by the Equation 2:

$$V_{MAX} = \left(1 + \sqrt{\frac{G_1^2 + \omega^2 C_1^2}{G_2^2 + \omega^2 C_2^2}}\right) t_F \left(2\alpha P_S + 4\beta P_S^3\right) \quad \text{[Equation 2]}$$

where $G_1$ is conductance of the ferroelectric film, $C_1$ is capacitance of the ferroelectric film, $G_2$ is conductance of the dielectric film, $C_2$ is capacitance of the dielectric film, $\omega$ is the angular frequency of the control voltage, $P_S$ is polarization of the ferroelectric film when the electric field $E_{FM}$ is applied to the ferroelectric film, $\alpha$ is a stability parameter, and $\beta$ is a skewness parameter.

A magnitude ratio $$\left(\frac{|Z_2|}{|Z_1|}\right)$$

of the impedance of the dielectric film to the impedance of the ferroelectric film may be 0.01 or greater.

The current density of current flowing through the dielectric film and the ferroelectric film may be 1 mA/cm² or less.

Spontaneous polarization of the ferroelectric film may be 20 μC/cm² or greater.

A dielectric dissipation factor of the dielectric film may be 0.1 or less.

In an aspect, provided is capacitor comprising a first electrode, a second electrode provided on the first electrode, a ferroelectric film provided between the first electrode and the second electrode, and a dielectric film provided between the ferroelectric film and the second electrode, the method comprising the step of controlling impedance of the ferroelectric film and impedance of the dielectric film to make a control voltage applied between the first electrode and the second electrode is-equal to a capacitance boosting operating voltage, and the capacitance boosting operating voltage is determined by the following equation 1:

$$V_{MAX} = \left(1 + \frac{|Z_2|}{|Z_1|}\right) t_F E_{FM}.$$

where $V_{MAX}$ is a capacitance boosting operating voltage, $Z_1$ is impedance of the ferroelectric film, $Z_2$ is impedance of the dielectric film, $t_F$ is a thickness of the ferroelectric film, and $E_{FM}$ is an electric field applied to the ferroelectric film having the maximum polarization change produced thereto.

The ferroelectric film may include a conductance component and a capacitance component connected in parallel, and the dielectric film may include a conductance component and a capacitance component connected in parallel.

The method may further include controlling an angular frequency of the control voltage such that the control voltage is equal to the capacitance boosting operating voltage, wherein the capacitance boosting operating voltage is determined by the following equation:

$$V_{MAX} = \left(1 + \sqrt{\frac{G_1^2 + \omega^2 C_1^2}{G_2^2 + \omega^2 C_2^2}}\right) t_F (2\alpha P_S + 4\beta P_S^3)$$

where $G_1$ is conductance of the ferroelectric film, $C_1$ is capacitance of the ferroelectric film, $G_2$ is conductance of the dielectric film, $C_2$ is capacitance of the dielectric film, $\omega$ is the angular frequency of the control voltage, $P_S$ is polarization of the ferroelectric film when the electric field $E_{FM}$ is applied to the ferroelectric film, $\alpha$ is a stability parameter, and $\beta$ is a skewness parameter.

A magnitude ratio $$\left(\frac{|Z_2|}{|Z_1|}\right)$$

of the impedance of the dielectric film to the impedance of the ferroelectric film may be 0.01 or greater.

When the control voltage is equal to the capacitance boosting operating voltage, the current density of current flowing through the dielectric film and the ferroelectric film may be 1 mA/cm² or less.

Spontaneous polarization of the ferroelectric film may be 20 pC/cm² or greater.

A dielectric dissipation factor of the dielectric film may be 0.1 or less.

In an aspect, provided is an electronic device. The electronic device may include a first electrode; a second electrode on the first electrode; a ferroelectric film between the first electrode and the second electrode, the ferroelectric film having a first impedance; and a dielectric film between the ferroelectric film and the second electrode, the dielectric film having a second impedance, wherein the ferroelectric film and the dielectric film are configured to have a capacitance boosting operating voltage substantially equal to a control voltage applied between the first electrode and the second electrode, and wherein the capacitance boosting operating voltage is determined by Equation 1:

$$V_{MAX} = \left(1 + \frac{|Z_2|}{|Z_1|}\right) t_F E_{FM} \qquad \text{[Equation 1]}$$

where $V_{MAX}$ is the capacitance boosting operating voltage, $Z_1$ is the first impedance, $Z_2$ is the second impedance, $t_F$ is a thickness of the ferroelectric film, and $E_{FM}$ is an electric field applied to the ferroelectric film having a maximum polarization change.

In an aspect, provided is a capacitor. The capacitor may include a first electrode; a second electrode on the first electrode; and an insulating structure, the insulating structure including a ferroelectric film between the first electrode and the second electrode, the ferroelectric film having a first impedance and a dielectric film between the ferroelectric film and the second electrode, the dielectric film having a second impedance, wherein the ferroelectric film and the dielectric film are configured to have a capacitance boosting operating voltage substantially equal to a control voltage applied between the first electrode and the second electrode, and wherein the capacitance boosting operating voltage is determined by Equation 1:

$$V_{MAX} = \left(1 + \frac{|Z_2|}{|Z_1|}\right) t_F E_{FM} \qquad \text{[Equation 1]}$$

where $V_{MAX}$ is the capacitance boosting operating voltage, $Z_1$ is the first impedance, $Z_2$ is the second impedance, $t_F$ is a thickness of the ferroelectric film, and $E_{FM}$ is an electric field applied to the ferroelectric film having a maximum polarization change.

The ferroelectric film may include a conductance component and a capacitance component connected in parallel, and the dielectric film may include a conduct. An angular frequency of the control voltage may be determined such that the control voltage is equal to the capacitance boosting operating voltage, and the capacitance boosting operating voltage is determined by Equation 2:

$$V_{MAX} = \left(1 + \sqrt{\frac{G_1^2 + \omega^2 C_1^2}{G_2^2 + \omega^2 C_2^2}}\right) t_F (2\alpha P_S + 4\beta P_S^3) \qquad \text{[Equation 2]}$$

where $G_1$ is conductance of the ferroelectric film, $C_1$ is capacitance of the ferroelectric film, $G_2$ is conductance of the dielectric film, $C_2$ is capacitance of the dielectric film, $\omega$ is the angular frequency of the control voltage, $P_S$ is polarization of the ferroelectric film when the electric field $E_{FM}$ is applied to the ferroelectric film, $\alpha$ is a stability parameter, and $\beta$ is a skewness parameter.

A magnitude ratio $$\left(\frac{|Z_2|}{|Z_1|}\right)$$

of the impedance of the dielectric film to the impedance of the ferroelectric film may be 0.01 or greater.

The current density of current flowing through the dielectric film and the ferroelectric film may be 1 mA/cm² or less.

Spontaneous polarization of the ferroelectric film may be 20 pC/cm² or greater.

A dielectric dissipation factor of the dielectric film may be 0.1 or less.

In an aspect, provided is a transistor including a substrate, the substrate including a source region and a drain region spaced apart by a channel region; and a gate structure on the channel region, the gate structure including a dielectric film, a ferroelectric film, and a gate electrode sequentially provided on the channel region, wherein the ferroelectric film, having a first impedance, and the dielectric film, having a second impedance, are configured to have a capacitance boosting operating voltage substantially equal to a control voltage applied between the gate electrode and the channel layer, and the capacitance boosting operating voltage is determined by Equation 1:

$$V_{MAX} = \left(1 + \frac{|Z_2|}{|Z_1|}\right) t_F E_{FM} \qquad \text{[Equation 1]}$$

where $V_{MAX}$ is a capacitance boosting operating voltage, $Z_1$ is the first impedance, $Z_2$ is the second impedance, $t_F$ is a thickness of the ferroelectric film, and $E_{FM}$ is an electric field applied to the ferroelectric film having the maximum polarization change produced thereto.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
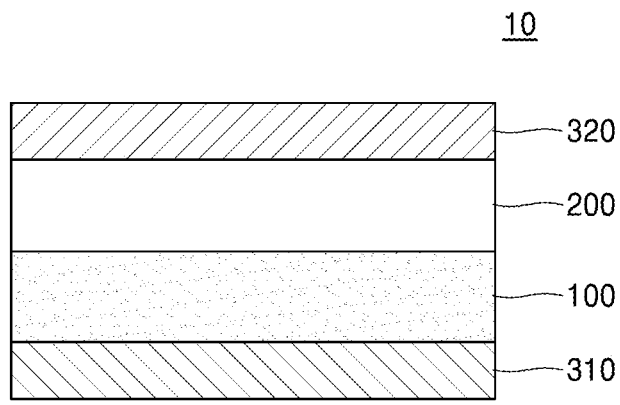
FIG. 1 is a cross-sectional view of a capacitor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in further detail with reference to the accompanying drawings. In the drawings, the same reference numerals refer to the elements, and the sizes of various components are exaggerated or reduced for clarity and brevity. Meanwhile, the following embodiment are presented by way of example only, and various changes and modifications may be made from the description of these embodiments.

In the following description, when an element is referred to as being "above" or "on" another element, it can be directly on the other element in a contact manner or in a non-contact manner.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

An expression used in the singular encompasses the expression of the plural, unless it has a clearly different meaning in the context. In addition, it will be understood that the term "comprising or including" specifies the addition and/or presence of one or more other components, but does not preclude the possibility of excluding the stated components features, unless the context clearly indicates otherwise.

Figure 2:
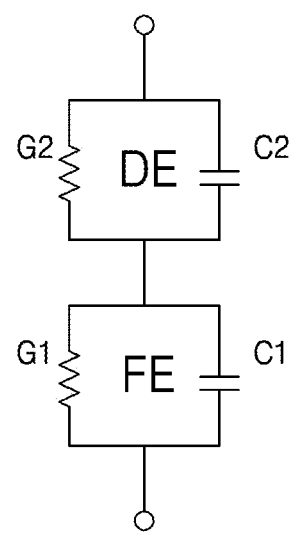
FIG. 2 is a circuit view of the capacitor shown in FIG. 1.

FIG. 1 is a cross-sectional view of a capacitor according to an example embodiment. FIG. 2 is a circuit view of the capacitor shown in FIG. 1. Referring to FIGS. 1 and 2, a capacitor 10, including a first electrode 310, an insulating structure IS and a second electrode 320. The insulating structure may include a ferroelectric film 100 and a dielectric film 200. The ferroelectric film 100 may include a ferroelectric material. A ferroelectric material refers to a non-conductor or a dielectric material exhibiting spontaneous polarization, and is distinguished from a multiferroic material that possesses two or more ferroic properties including, for example, ferroelectricity, ferroelasticity, ferromagnetism, and/or anti-ferromagnetism. Examples of the ferroelectric material may include at least one of an oxide ferroelectric material, a polymer ferroelectric material, a fluoride ferroelectric material (such as $BaMgF_4$ (BMF)), and/or a ferroelectric semiconductor.

Examples of the oxide ferroelectric material include perovskite ferroelectric materials such as $PbZr_xTi_{1-x}O_3$ (PZT), $BaTiO_3$, $PbTiO_3$, pseudo-ilmenite ferroelectric materials such as $LiNbO_3$ or $LiTaO_3$, tungsten-bronze (TB) ferroelectric materials such as $PbNb_3O_6$ and $Ba_2NaNb_5O_{15}$, bismuth layer-structured ferroelectric materials such as $SrBi_2Ta_2O_9$ (SBT), $(Bi,La)_4Ti_3O_{12}$ (BLT), or $Bi_4Ti_3O_{12}$, pyrochlore ferroelectric materials such as $La_2Ti_2O_7$, solid solutions thereof, and rare-earth ferroelectric materials such as $RMnO_3$ and $Pb_6Ge_3O_{11}$ (PGO) including a rare-earth element such as Y, Er, Ho, Tm, Yb, and/or Lu. Examples of the polymer ferroelectric material may include at least one of polyvinylidene fluoride (PVDF), PVDF polymer, PVDF copolymer, PVDF terpolymer, cyano-polymer, and/or copolymers thereof. Examples of the ferroelectric semiconductor may include 2-6 group compounds including CdZnTe, CdZnS, CdZnSe, CdMnS, CdFeS, CdMnSe, and CdFeSe.

The ferroelectric material may have spontaneous polarization. For example, the spontaneous polarization of the ferroelectric film 100 may be 20 $\mu C/cm^2$ or greater. The ferroelectric film 100 may include a conductance component and a capacitance component connected in parallel. Impedance of the ferroelectric film 100 will later be described.

The dielectric film 200 may include a material capable of achieving a desired capacitance. For example, as the integration level of an integrated circuit device including the capacitor 10 is increased, an area occupied by the capacitor 10 is gradually reduced, and thus dielectrics having a high dielectric constant may be favorably used. The dielectric film 200 may include a material having a high dielectric constant. The high dielectric constant may mean a dielectric constant higher than that of silicon oxide. In an embodiment, the dielectric film may include a dielectric metal oxide. The dielectric metal oxide may include, for example, at least one of Ca, Sr, Ba, Sc, Y, La, Ti, Hf, Zr, Nb, Ta, Ce, Pr, Nd, Gd, Dy, Yb, and Lu. For example, the dielectric film 200 may include $HfO_2$, $ZrO_2$, $CeO_2$, $La_2O_3$, $Ta_2O_3$, or $TiO_2$. The dielectric film 200 may have a single layered structure or multiple layered structures. The dielectric film, for example, may include a heterostructure including one or more dielectric metal oxides, and/or a homostructure including one dielectric metal oxide. The thickness of the dielectric film 200 may be determined based on the desired capacitance for the capacitor. For example, the dielectric film 200 may have a thickness of 10 nanometers (nm) or less.

The dielectric film 200 may include a conductance component and a capacitance component connected in parallel. Impedance of the dielectric film 200 will later be described. In an embodiment, a dielectric dissipation factor of the dielectric film may be 1 or less.

The first electrode 310 may be at a side opposite to the dielectric film 200 with respect to the ferroelectric film 100. For example, the first electrode 310 may directly contact the ferroelectric film 100 and not the dielectric film 200. The first electrode 310 may include an electrically conductive material. For example, the first electrode 310 may include a metal, a metal nitride, a metal oxide, a carbon-based conductor, or a combination thereof. For example, the first electrode 310 may include at least one of Au, Al, TiN, MoN, CoN, TaN, TiAlN, TaAlN, W, Ru, $RuO_2$, $SrRuO_3$, Ir, $IrO_2$, Pt, PtO, $SrRuO_3$ (SRO), $((Ba,Sr)RuO_3)$ (BSRO), $CaRuO_3$ (CRO), $(La,Sr)CoO_3$ (LSCO), graphene, and/or a combination thereof.

The second electrode 320 may be provided at a side opposite to the ferroelectric film 100 with respect to the dielectric film 200. For example, the second electrode 320 may directly contact the dielectric film 200 and not the ferroelectric film 100. The second electrode 320 may include an electrically conductive material. For example, the second electrode 320 may include a metal, a metal nitride, a metal oxide, a conductive carbon, or a combination thereof. For example, the second electrode 320 may include at least one of Au, Al, TiN, MoN, CoN, TaN, TiAlN, TaAlN, W, Ru, $RuO_2$, $SrRuO_3$, Ir, $IrO_2$, Pt, PtO, $SrRuO_3$ (SRO), $((Ba,Sr)RuO_3)$ (BSRO), $CaRuO_3$ (CRO), $(La,Sr)CoO_3$ (LSCO), graphene, and/or a combination thereof. In an example embodiment, the first electrode 310, the ferroelectric film 100, the dielectric film 200, and the second electrode 320 may be sequentially stacked on a substrate (not shown), thereby forming a capacitor 10.

Referring to FIG. 2, the ferroelectric film 100 may include be represented by a conductance component and a capacitance component electrically connected in parallel. In the following description, the conductance component of the ferroelectric film 100 may be referred to as first conductance G1, and the capacitance component of the ferroelectric film 100 may be referred to as first capacitance C1. For example, the ferroelectric film 100 may have a first impedance. The dielectric film 200 may also include a conductance component and a capacitance component electrically connected in parallel. In the following description, the conductance component of the dielectric film 200 may be referred to as second conductance G2. The capacitance component of the dielectric film 200 may be referred to as second capacitance C2. That is, the dielectric film 200 may have a second impedance.

A control voltage may be applied to the capacitor 10 through the first electrode 310 and/or the second electrode 320. For example, the control voltage may be an alternating-current voltage having an angular frequency $\omega$. The control voltage may be substantially the same as the capacitance boosting operating voltage that generates a capacitance boosting effect in the ferroelectric film 100. The capacitance boosting effect refers to a sharp increase in the capacitance of the ferroelectric film 100. The capacitance boosting effect may be generated when the ferroelectric film 100 has negative capacitance.

The capacitance boosting operating voltage may be expressed by the following Equation (1):

$$V_{MAX} = \left(1 + \frac{|Z_2|}{|Z_1|}\right) t_F E_{FM}. \quad \text{[Equation 1]}$$

where $V_{MAX}$ is a capacitance boosting operating voltage, $Z_1$ is impedance of the ferroelectric film, $Z_2$ is impedance of the dielectric film, $t_F$ is a thickness of the ferroelectric film, and $E_{FM}$ is an electric field applied to the ferroelectric film having a maximum polarization change.

In Equation (1), the thickness $T_F$ of the ferroelectric film 100 and the electric field $E_{FM}$ applied to the ferroelectric film 100 having the maximum polarization change produced thereto have fixed values, and thus the capacitance boosting operating voltage $V_{MAX}$ may be controlled by adjusting the amplitude ratio of the impedance $Z_1$ of the ferroelectric film 100 to the impedance $Z_2$ of the dielectric film. For example, a magnitude ratio $$\left(\frac{|Z_2|}{|Z_1|}\right)$$

of the impedance $Z_2$ of the dielectric film 200 to the impedance $Z_1$ of the ferroelectric film 100 may be 0.01 or greater.

The electrical field applied to the ferroelectric film having the maximum polarization change produced thereto may be an electric field in which the value of $$\frac{dP}{dE_l}$$

is largest. Here, P is polarization of the ferroelectric film, and $E_F$ is an electric field applied to the ferroelectric film. The impedance $Z_1$ of the ferroelectric film 100 may be expressed by Equation 3:

$$Z_1 = \frac{G_2}{G_1^2 + \omega^2 C_1^2} - j\omega \frac{C_1}{G_1^2 + \omega^2 C_1^2} \quad \text{[Equation 3]}$$

where $G_1$ is conductance of the ferroelectric film, $C_1$ is capacitance of the ferroelectric film, and $\omega$ is the angular frequency of the control voltage.

The impedance $Z_2$ of the dielectric film 200 may be expressed by the following equation 3:

$$Z_2 = \frac{G_2}{G_2^2 + \omega^2 C_2^2} - j\omega \frac{C_2}{G_2^2 + \omega^2 C_2^2} \quad \text{[Equation 3]}$$

where $G_2$ is conductance of the dielectric film, $C_2$ is capacitance of the dielectric film, and $\omega$ is the angular frequency of the control voltage.

The electric field $E_F$ applied to the ferroelectric film 100 may be expressed by the following equation 4:

$$E_f = 2\alpha P_S + 4\beta P_S^3 \quad \text{[Equation 4]}$$

where $P_S$ is polarization of the ferroelectric film when the electric field $E_{FM}$ is applied to the ferroelectric film, $\alpha$ is a stability parameter, and $\beta$ is a skewness parameter.

The stability parameter a and the skewness parameter β may be acquired by performing a Landau fitting process on a polarization-electric field curve of the ferroelectric film 100.

When Equations 2 to 4 are substituted for Equation (1), the capacitance boosting operating voltage $V_{MAX}$ may be expressed by the following Equation 5:

$$V_{MAX} = \left(1 + \sqrt{\frac{G_1^2 + \omega C_1^2}{G_2^2 + \omega^2 C_2^2}}\right) t_F \left(2\alpha P_S + 4\beta P_S^3\right). \quad \text{[Equation 5]}$$

In Equation 5, the first conductance $G_1$, the first capacitance $C_1$, the second conductance $G_2$, the second capacitance $C_2$, the thickness $t_F$ of the ferroelectric film 100, the stability parameter ($\alpha$), the skewness parameter ($\beta$), and the polarization $P_S$ of the ferroelectric film when the electric field $E_{FM}$ is applied to the ferroelectric film, may have fixed values. Therefore, the capacitance boosting operating voltage $V_{MAX}$ may be controlled by adjusting the angular frequency ω of the control voltage.

In an example embodiment, the current density of current flowing through the ferroelectric film 100 and the dielectric film 200 may be 1 mA/cm² or less.

The control voltage applied between the first electrode 310 and the second electrode 320 may be determined according to a semiconductor device (e.g., DRAM) employing the capacitor 10. The present disclosure may provide the capacitor 10 in which a magnitude ratio $$\left(\frac{|Z_2|}{|Z_1|}\right)$$

of the impedance of the dielectric film 200 to the impedance of the ferroelectric film 100 is determined such that the control voltage is equal to capacitance boosting operating voltage. The present disclosure may provide the capacitor 10 in which the angular frequency ω of the control voltage is determined such that the control voltage is equal to the capacitance boosting operating voltage.

Figure 3:
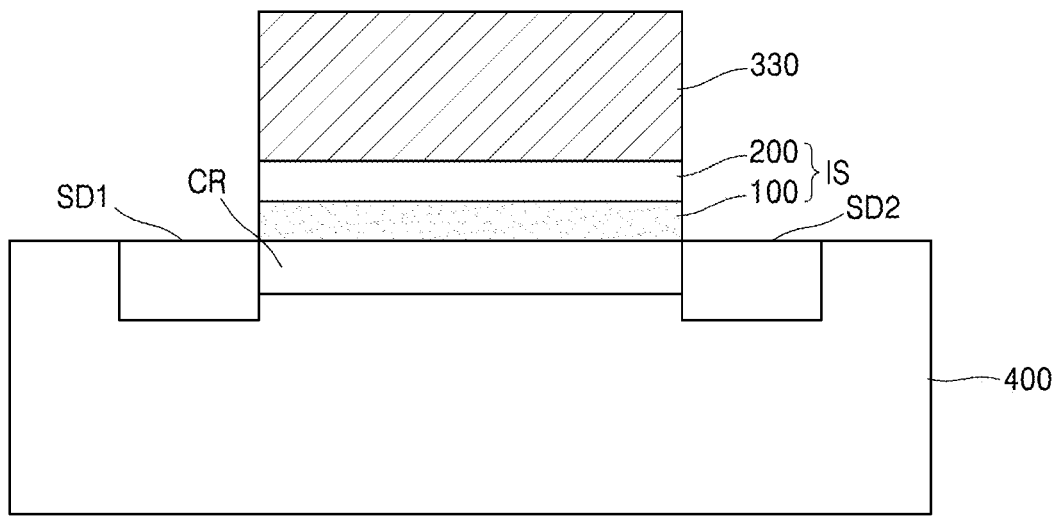
FIG. 3 is a cross-sectional view of a transistor according to an example embodiment.

FIG. 3 is a cross-sectional view of a transistor according to an example embodiment. For brevity, descriptions of substantially the same content as described above with reference to FIGS. 1 and 2 may not be given.

Referring to 3, a transistor 20 may include a substrate 400, a source region SD1, a drain region SD2, a channel region CR between the source region SD1 and drain region SD2, an insulating structure IS, and a gate electrode 330. The insulating structure IS may include a ferroelectric film 100 and a dielectric film 200.

The substrate 400 may include a semiconductor material. For example, the substrate 400 may be a silicon (Si) substrate, a germanium (Ge) substrate 400, and/or a silicon germanium (SiGe) substrate. The substrate 400 may be of a first conductivity type. For example, the first conductivity type may be an n type. In the case wherein the substrate 400 includes a semiconductor material, the substrate 400 may include the channel region CR. In this case, the channel region CR may be a doped section of substrate 400. The channel region may act like an electrode in a metal-oxide semiconductor capacitor (MOS capacitor). For example, in the case wherein the substrate has an n-type conductivity, the transistor may include a p-type MOS (pMOS) capacitor with holes as the carriers in the inversion type. In this case, the MOS structure may perform as a MOS capacitor when the transistor is in an "ON" state, for example, when a voltage is applied to the gate electrode 330.

The source region SD1 and the drain region SD2 may be on the substrate 400. The source region SD1 and the drain region SD2 may be spaced apart from each other in a direction parallel to a top surface of the substrate 400. The source region SD1 and the drain region SD2 may be formed by injecting impurities into a top portion of the substrate 400. For example, the source region SD1 and the drain region SD2 may be of a second conductivity type different from the first conductivity type. For example, the second conductivity type may be a p type. The source region SD1 and the drain region SD2 may also include electrodes on top of the source region SD1 and the drain region SD2. The electrodes may include an electrically conductive material.

The ferroelectric film 100, the dielectric film 200, and the gate electrode 330 may be between the source region SD1 and the drain region SD2. The ferroelectric film 100, the dielectric film 200, and the gate electrode 330 may be sequentially stacked on the substrate 400. For example, the ferroelectric film 100, the dielectric film 200, and the gate electrode 330 may be sequentially stacked over the channel region CR. The ferroelectric film 100 and the dielectric film 200 may be substantially the same as those described with reference to FIG. 1.

The gate electrode 330 may include an electrically conductive material. For example, the gate electrode 330 may include aluminum (Al), gold (Au), tungsten (W), or a combination thereof. A control voltage may be applied between the gate electrode 330 and the substrate 400. For example, the control voltage may be applied to the gate electrode 330, and the substrate 400 may be grounded. For example, the control voltage may be an alternating-current voltage having an angular frequency ω. The structure including the ferroelectric film 100 and the dielectric film 200 stacked may have a capacitance boosting effect that the capacitance is greatly increased at the capacitance boosting operating voltage (e.g., $V_{MAX}$ in Equations 1 and 5). For example, the capacitance boosting effect may be generated by the ferroelectric film 100 having negative capacitance.

The control voltage applied between the gate electrode 330 and the substrate 400 may be determined in advance. The present disclosure may provide the transistor 20 in which a magnitude ratio $$\left(\frac{|Z_2|}{|Z_1|}\right)$$

of the impedance of the dielectric film 200 to the impedance of the ferroelectric film 100 is determined such that the control voltage is equal to the capacitance boosting operating voltage. The present disclosure may provide the transistor 20 in which the angular frequency ω of the control voltage is determined such that the control voltage is equal to the capacitance boosting operating voltage.

Figure 4:
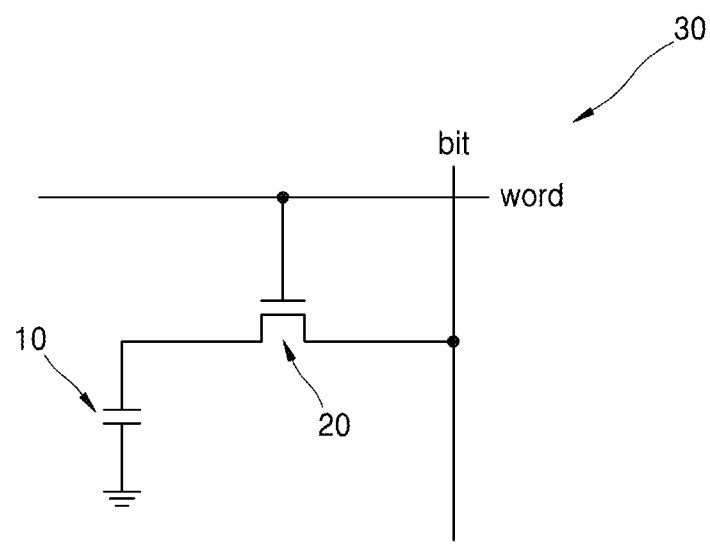
FIG. 4 illustrates a circuit configuration of a memory cell of a memory device including a semiconductor device and a capacitor.
Figure 5:
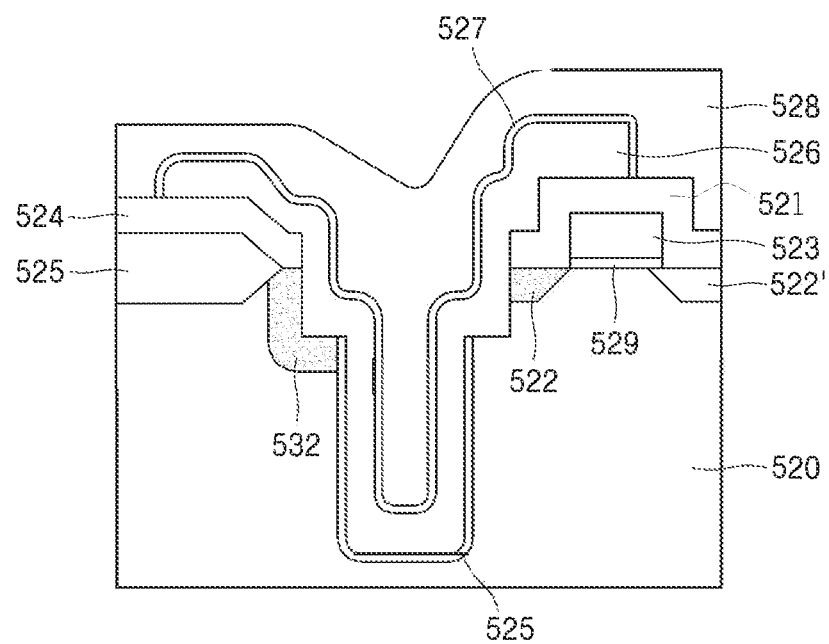
FIG. 5 illustrates a structure of a trench capacitor-type dynamic random access memory (DRAM)

The transistor 20 and the capacitor 10 described above together may constitute a memory cell. For example, FIG. 4 illustrates a circuit configuration of a memory cell 30 of a memory device including the transistor 20 and the capacitor 10. FIG. 5 illustrates an example embodiment of an integrated circuit design including the memory cell. Referring to FIG. 4, the memory cell 30 may include the transistor 20 and the capacitor 10 electrically connected to the source region SD1 of the transistor 20. The memory device may include a plurality of bit lines and a plurality of word lines, and may further include a plurality of the memory cells illustrated in FIG. 4. Each word line may be electrically connected to the gate electrode 330 of the transistor 20, and each bit line may be electrically connected to the drain region SD2 of the transistor 20. The first electrode 310 of the capacitor 10 may be electrically connected to the source region SD1 of the transistor 20, and the second electrode 320 of the capacitor 10 may be connected to a voltage controller configured to control the angular frequency of a control voltage applied to the capacitor 10.

FIG. 5 illustrates a structure of a trench capacitor-type dynamic random access memory (DRAM).

Referring to FIG. 5, on a semiconductor substrate 520, a device isolation region may be defined with a field oxide film 521, and a gate electrode 523 and source/drain impurity regions 522 and 522' may be formed in the device isolation region. A gate oxide layer 529 may be formed between the gate electrode 523 and the semiconductor substrate 520. An oxide film may be formed as an interlayer insulating film 524. A region not to be a trench may be capped with a trench buffer layer, and a part of the source region 522 may be open to form a contact portion.

A trench is formed in a sidewall of the interlayer insulating film 524, and a sidewall oxide film 525 may be formed over the entire sidewall of the trench. The sidewall oxide film 525 may compensate for damage in the semiconductor substrate caused by etching to form the trench, and may serve as a dielectric film between the semiconductor substrate 520 and a storage electrode 526. A sidewall portion of part of the source region 522, except for the other part of the source region near the gate electrode 523, may be entirely exposed.

A PN junction (not illustrated) may be formed in the sidewall portion of the source region by impurity implantation. The trench may be formed in the source region 522. A sidewall of the trench near the gate may directly contact the source region 522, and the PN junction may be formed by additional impurity implantation into the source region.

A storage electrode 526 may be formed on part of the interlayer insulating film 524, the exposed source region 522, and the surface of the sidewall oxide film 525 in the trench. The storage electrode 526 may be formed to contact the entire source region 522 in contact with the upper sidewall of the trench, in addition to the part of the source region 522 near the gate electrode 523. Next, an insulating film 527 as a capacity dielectric film may be formed along the upper surface of the storage electrode 526, and a polysilicon layer as a plate electrode 528 may be formed thereon, thereby completing a trench capacitor type DRAM. The insulating film 527, and/or the interlayer insulating film 524, for example, may be an embodiment of the insulating structure IS including a ferroelectric film 100 and a dielectric film 200.

The aforementioned electronic devices including an insulating structure IS including a ferroelectric film 100 and a dielectric film 200 may be applied to various electronic circuit devices including a transistor, for example as part of processing circuity and/or memory.

Figure 6:
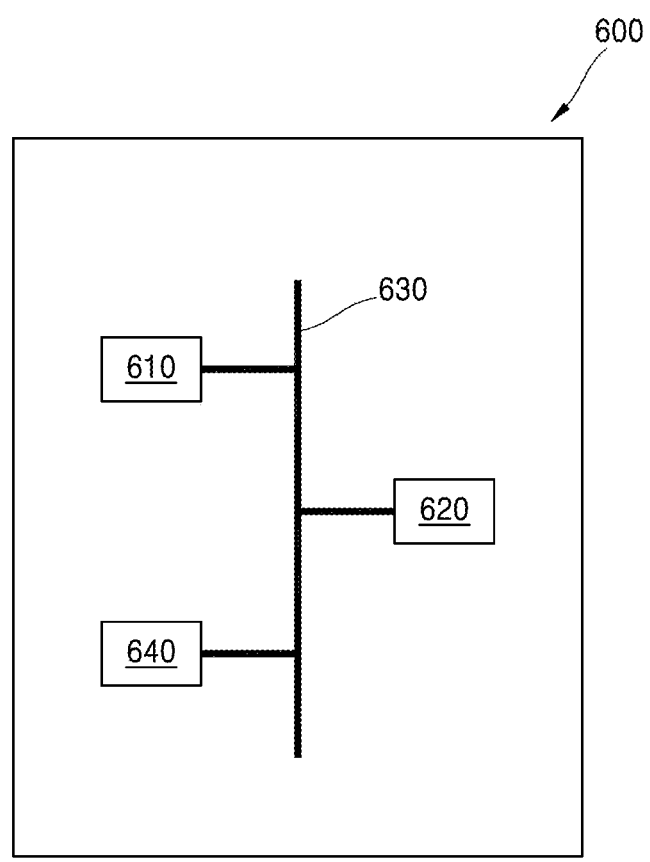
FIG. 6 shows a schematic of a circuit that may include the aforementioned electronic devices according to some example embodiments.

FIG. 6 shows a schematic of a circuit that may include the aforementioned electronic devices according to some example embodiments.

As shown, the electronic device 600 includes one or more electronic device components, including a processor (e.g., processing circuitry) 610 and a memory 620 that are communicatively coupled together via a bus 630.

The processing circuitry 610, may be included in, may include, and/or may be implemented by one or more instances of processing circuitry such as hardware including logic circuits, a hardware/software combination such as a processor executing software; or a combination thereof. For example, the processing circuitry 600 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 620 may include a non-transitory computer readable storage device, for example a solid state drive (SSD), storing a program of instructions, and the processing circuitry 600 may be configured to execute the program of instructions to implement the functionality of the electronic device 600.

In some example embodiments, the electronic device 600 may include one or more additional components 640, coupled to bus 630, which may include, for example, a power supply, a light sensor, a light-emitting device, any combination thereof, or the like. In some example embodiments, one or more of the processing circuitry 610, memory 620, and/or one or more additional components 640 may include an electronic device including electrodes and an insulating structure including a ferroelectric film 100 and a dielectric film 200, as described above, such that the one or more of the processing circuitry 610, memory 620, and/or one or more additional components 640, and thus, the electronic device 600, may include the transistor 20 (refer to FIG. 3), the capacitor 10 (refer to FIG. 3), and/or the memory cell 30 (refer to FIG. 5).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
a first electrode;
a second electrode on the first electrode;
a ferroelectric film between the first electrode and the second electrode, the ferroelectric film having a first impedance; and
a dielectric film between the ferroelectric film and the second electrode, the dielectric film having a second impedance,
wherein the ferroelectric film and the dielectric film are configured to have a capacitance boosting operating voltage substantially equal to a control voltage applied between the first electrode and the second electrode, and
wherein the capacitance boosting operating voltage is determined by the following equation:

$$V_{MAX} = \left(1 + \frac{|Z_2|}{|Z_1|}\right) t_F E_{FM}$$

where $V_{MAX}$ is the capacitance boosting operating voltage, $Z_1$ is the first impedance, $Z_2$ is the second impedance, $t_F$ is a thickness of the ferroelectric film, and $E_{FM}$ is an electric field applied to the ferroelectric film having a maximum polarization change.

2. The electronic device of claim 1, wherein
the first impedance ($Z_1$) is determined based on a conductance component ($G_1$) of the ferroelectric film and a capacitance component ($C_1$) of the ferroelectric film, and
the second impedance ($Z_2$) is determined based on a conductance component ($G_2$) of the dielectric film and a capacitance component ($C_2$) of the dielectric film.

3. The electronic device of claim 1, wherein
an angular frequency of the control voltage is determined such that the control voltage is equal to the capacitance boosting operating voltage, and
the capacitance boosting operating voltage is determined by the following equation:

$$V_{MAX} = \left(1 + \sqrt{\frac{G_1^2 + \omega C_1^2}{G_2^2 + \omega^2 C_2^2}}\right) t_F \left(2\alpha P_S + 4\beta P_S^3\right)$$

where $$\sqrt{\frac{G_1^2 + \omega^2 C_1^2}{G_2^2 + \omega^2 C_2^2}}$$

represents the $$\frac{|Z_2|}{|Z_1|},$$

represents the $E_{FM}$, $G_1$ is conductance of the ferroelectric film, C1 is capacitance of the ferroelectric film, $G_2$ is conductance of the dielectric film, $C_2$ is capacitance of the dielectric film, $\omega$ is the angular frequency of the control voltage, Ps is polarization of the ferroelectric film when the electric field is applied to the ferroelectric film, $\alpha$ is a stability parameter, and $\beta$ is a skewness parameter.

4. The electronic device of claim 1, wherein the magnitude ratio $$\left(\frac{|Z_2|}{|Z_1|}\right)$$

of the impedance of the dielectric film to the first impedance of the ferroelectric film is 0.01 or greater.

5. The electronic device of claim 1, wherein current density of current flowing through the dielectric film and the ferroelectric film is 1 mA/cm² or less.

6. The electronic device of claim 1, wherein spontaneous polarization of the ferroelectric film is 20 μC/cm² or more.

7. The electronic device of claim 1, wherein a dielectric dissipation factor of the dielectric film is 0.1 or less.

8. The electronic device of claim 1, wherein the ferroelectric film includes at least one of an oxide ferroelectric material, a polymer ferroelectric material, a fluoride ferroelectric material, and a ferroelectric semiconductor.

9. The electronic device of claim 8, wherein the oxide ferroelectric material includes at least one of a perovskite ferroelectric material, a tungsten-bronze ferroelectric material, a bismuth layer-structured ferroelectric material, and a rare-earth ferroelectric material.

10. The electronic device of claim 1, wherein the dielectric film has a high dielectric constant.

11. The electronic device of claim 1, wherein the dielectric film is an oxide, and
the oxide includes at least one of Ca, Sr, Ba, Sc, Y, La, Ti, Hf, Zr, Nb, Ta, Ce, Pr, Nd, Gd, Dy, Yb, and Lu.

12. The electronic device of claim 1, wherein the dielectric film has a thickness of 10 nanometers or less.

13. The electronic device of claim 1, wherein
the first electrode includes a conductive material,
the second electrode includes a conductive material, and
the electronic device is a capacitor.

14. The electronic device of claim 1, wherein
the first electrode includes a semiconductor substrate,
the second electrode includes a conductive material, and
the electronic device is a transistor.

15. The electronic device of claim 14, wherein the electronic device is configured to perform as a metal-oxide-semiconductor capacitor during an ON operation of the transistor.

16. The electronic device of claim 14, further comprising:
a source region, a drain region, and a channel region in the semiconductor substrate,
wherein the second electrode is a gate electrode.

17. The electronic device of claim 16, wherein the channel region has an opposite conductivity type to the source region and the drain region.

18. The electronic device of claim 17, wherein
the channel region as an n-type conductivity, and
the source region and the drain region have a p-type conductivity.

19. A method of controlling a capacitor comprising a first electrode, a second electrode on the first electrode, a ferroelectric film between the first electrode and the second electrode, and a dielectric film between the ferroelectric film and the second electrode, the method comprising:
controlling an impedance of the ferroelectric film and an impedance of the dielectric film such that a control voltage applied between the first electrode and the second electrode is substantially equal to a capacitance boosting operating voltage, wherein the capacitance boosting operating voltage is determined by the following equation:

$$V_{MAX} = \left(1 + \frac{|Z_2|}{|Z_1|}\right) t_F E_{FM}$$

where $V_{MAX}$ is a capacitance boosting operating voltage, $Z_1$ is the impedance of the ferroelectric film, $Z_2$ is the impedance of the dielectric film, $t_F$ is a thickness of the ferroelectric film, and $E_{FM}$ is an electric field applied to the ferroelectric film having a maximum polarization change.

20. The method of claim 19, wherein
the first impedance ($Z_1$) is determined based on a conductance component ($G_1$) of the ferroelectric film and a capacitance component ($C_1$) of the ferroelectric film, and the second impedance ($Z_2$) is determined based on a conductance component ($G_2$) of the dielectric film and a capacitance component ($C_2$) of the dielectric film.

21. The method of claim 19, further comprising:
controlling an angular frequency of the control voltage such that the control voltage is equal to the capacitance boosting operating voltage,
wherein the capacitance boosting operating voltage is determined by the following equation:

$$V_{MAX} = \left(1 + \sqrt{\frac{G_1^2 + \omega C_1^2}{G_2^2 + \omega^2 C_2^2}}\right) t_F \left(2\alpha P_S + 4\beta P_S^3\right)$$

where $$\left(\sqrt{\frac{G_1^2 + \omega^2 C_1^2}{G_2^2 + \omega^2 C_2^2}}\right)$$

represents the $$\frac{|Z_2|}{|Z_1|},$$

represents the EFM, $G_1$ is conductance of the ferroelectric film, $C_1$ is capacitance of the ferroelectric film, $G_2$ is conductance of the dielectric film, $C_2$ is capacitance of the dielectric film, $\omega$ is the angular frequency of the control voltage, Ps is polarization of the ferroelectric film when the electric field $E_{FM}$ is applied to the ferroelectric film, $\alpha$ is a stability parameter, and $\beta$ is a skewness parameter.

22. The method of claim 19, wherein the magnitude ratio $$\left(\frac{|Z_2|}{|Z_1|}\right)$$

of the impedance of the dielectric film to the first impedance of the ferroelectric film is 0.01 or greater.

23. The method of claim 19, wherein when the control voltage is equal to the capacitance boosting operating voltage, a current density of current flowing through the dielectric film and the ferroelectric film is 1 mA/cm$^2$ or less.

24. The method of claim 19, wherein spontaneous polarization of the ferroelectric film is 20 µC/cm$^2$ or more.

25. The method of claim 19, wherein a dielectric dissipation factor of the dielectric film is 0.1 or less.

* * * * *